United States Patent
Cho et al.

(10) Patent No.: US 9,159,865 B2
(45) Date of Patent: Oct. 13, 2015

(54) METHOD OF FORMING ZINC OXIDE PROMINENCE AND DEPRESSION STRUCTURE AND METHOD OF MANUFACTURING SOLAR CELL USING THEREOF

(75) Inventors: Jun-Sik Cho, Daejeon (KR); Kyung-Hoon Yoon, Daejeon (KR); SeJin Ahn, Daejeon (KR); Jihye Gwak, Daejeon (KR); Jae-Ho Yun, Daejeon (KR); Ara Cho, Seoul (KR); Kee-Shik Shin, Daejeon (KR); SeoungKyu Ahn, Daejeon (KR); Young-Joo Eo, Daejeon (KR); Jin-Su Yoo, Seoul (KR); Sang-Hyun Park, Daejeon (KR); Joo-Hyung Park, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 0 days.

(21) Appl. No.: 14/118,529

(22) PCT Filed: Aug. 14, 2012

(86) PCT No.: PCT/KR2012/006463
§ 371 (c)(1),
(2), (4) Date: Nov. 18, 2013

(87) PCT Pub. No.: WO2013/133491
PCT Pub. Date: Sep. 12, 2013

(65) Prior Publication Data
US 2014/0065760 A1    Mar. 6, 2014

(30) Foreign Application Priority Data
Mar. 6, 2012 (KR) .......... 10-2012-0022668

(51) Int. Cl.
*H01L 21/00*    (2006.01)
*H01L 31/18*    (2006.01)
(Continued)

(52) U.S. Cl.
CPC ............ *H01L 31/1828* (2013.01); *H01G 9/204* (2013.01); *H01L 31/02366* (2013.01);
(Continued)

(58) Field of Classification Search
CPC .................. H01L 31/0224; H01L 31/022466; H01L 31/022483; H01L 31/0232; H01L 31/076
USPC ........ 257/E21.02, 786, 40, 43; 438/104, 669, 438/128
See application file for complete search history.

(56) References Cited

U.S. PATENT DOCUMENTS

2009/0133751 A1* 5/2009 Sreenivasan et al. .......... 136/256
2010/0133527 A1* 6/2010 Lin et al. .......... 257/43
2011/0018427 A1* 1/2011 Hu et al. .......... 313/495
(Continued)

FOREIGN PATENT DOCUMENTS

JP    2011-166016 A    8/2011
KR    10-2009-0084539 A    5/2009
(Continued)

*Primary Examiner* — Thanh Y Tran
(74) *Attorney, Agent, or Firm* — Seed IP Law Group PLLC

(57) ABSTRACT

A method of forming a nanometer-scale prominence and depression structure on a zinc oxide thin film in a wet-etching method, and the method includes the steps of: preparing a substrate; forming a nano structure having a height and a width of a nanometer range; forming the zinc oxide thin film on the substrate on which the nano structure is formed; and wet-etching the zinc oxide thin film, in which in the wet-etching step, zinc oxide having relatively low physical compactness is preferentially etched since the zinc oxide is positioned on the nano structure, and thus the prominence and depression structure is formed around the nano structure by the etching.

The method is effective in that a thin film can be uniformly formed on the prominence and depression structure, and an electrolyte or an organic material may uniformly penetrate between the prominence and depression structure.

10 Claims, 5 Drawing Sheets

(51) Int. Cl.
  *H01L 31/0236* (2006.01)
  *H01L 51/42* (2006.01)
  *H01G 9/20* (2006.01)
  *H01L 51/44* (2006.01)

(52) U.S. Cl.
  CPC ............ *H01L31/1888* (2013.01); *H01L 51/42* (2013.01); *H01L 51/4233* (2013.01); *H01G 9/209* (2013.01); *H01G 9/2059* (2013.01); *H01L 51/447* (2013.01); *Y02E 10/542* (2013.01); *Y02E 10/549* (2013.01)

(56) References Cited

U.S. PATENT DOCUMENTS

2011/0284061 A1* 11/2011 Vanecek et al. ............... 136/255
2012/0015147 A1* 1/2012 Maa et al. ..................... 428/148

FOREIGN PATENT DOCUMENTS

| KR | 10-1040956 B1 | 9/2010 |
| KR | 10-2011-0043402 A | 4/2011 |
| KR | 10-2011-0105393 A | 9/2011 |

* cited by examiner

METHOD OF FORMING ZINC OXIDE PROMINENCE AND DEPRESSION STRUCTURE AND METHOD OF MANUFACTURING SOLAR CELL USING THEREOF

CROSS-REFERENCE TO RELATED APPLICATION(S)

This Application is a 371 National Stage Application of International Application No. PCT/KR2012/006463, filed on Aug. 14, 2012, published as International Publication No. WO 2013/133491, which claims priority to Korean Patent Application No. 10-2012-0022668, filed on Mar. 6, 2012, the contents of which are incorporated by reference in their entireties.

TECHNICAL FIELD

The present invention relates to a method of forming a zinc oxide prominence and depression structure, and more specifically, to a method of forming a nanometer-scale prominence and depression structure on a zinc oxide thin film in a wet-etching method, and a method of manufacturing a solar cell using thereof.

BACKGROUND ART

Zinc oxide (ZnO) is a material of a wurzite crystal structure having a hexagonal structure, which is a direct transition type semiconductor material having a wide band gap of 3.32 eV at a room temperature and can be implemented to have features of a transparent object or the like with respect to semiconductor, piezo-electricity, ferroelectric substance, ferromagnetic substance, conductor, visible light and the like depending on a doping material.

In addition, a zinc oxide thin film may be advantageously grown on various types of substrates. Accordingly, a variety of devices can be manufactured by attaching a semiconductor film such as silicon, a metal film such as platinum or a transparent conductive film such as ITO on the zinc oxide thin film.

The zinc oxide used for an electronic device is generally used in the form of a thin film. However, recently, use of a nano rod or a nano wire having a nano structure is increased. The zinc oxide has a polar semiconductor structure, and since the surface is finished with a material of either zinc or oxygen with respect to (0002) plane, stress energy of the surface is different on each (0002) plane, and since the growth rate on the c-axis is larger than those on the other axes due to such a crystallographic characteristic, a nano structure of a nano rod or nano wire form can be grown using this feature.

Studies on applying such a zinc oxide nano structure to a solar cell are actively under progress. It is since that if the zinc oxide nano structure is used, the surface area of a solar cell may be extended greatly, and efficiency of the solar cell may be improved by reducing moving distance of electrons and holes generated through optical absorption and preventing recombination of the electrons and holes.

In a typical method of fabricating a zinc oxide nano structure applied to a solar cell, first, nano dots of Au or an Au—Zn alloy are formed on a substrate as a seed of a zinc oxide nano wire, and then the zinc oxide is grown thereon by applying a vapor-liquid-solid (VLS) or vapor-solid (VS) growth method.

Such a conventional method of forming a nano structure may not adjust thickness of the nano structure and uses expensive Au in the process of forming a seed layer.

Since the zinc oxide nano wire has a large aspect ratio, it is difficult to uniformly deposit a thin film on the surface of the zinc oxide nano wire, and since the zinc oxide nano wire has a weak strength, it is difficult to be manufactured as a device such as a solar cell.

In addition, the holes and electrons generated in the solar cell are difficult to move smoothly since the nano wire is thin and thus has a large resistance, and since doping materials for forming the nano wire are limited and the amount of a doping material is difficult to precisely adjust, electrical conductivity cannot be improved through the doping.

Furthermore, since a growth direction of the zinc oxide nano wire cannot be controlled, the nano wire is difficult to be manufactured as a device such as a solar cell if the nano wire does not grow uniformly and vertically. Particularly, although an electrolyte or an organic material should penetrate between the nano wires in the case of a dye-sensitized solar cell or an organic solar cell, if the nano wire does not grow uniformly and vertically, the electrolyte or the organic material may not uniformly penetrate between the nano wires.

Korean Patent Reg. No. 10-1040956 discloses a technique of applying a zinc oxide nano wire structure to a thin film silicon solar cell. This patent relates to a method of manufacturing a thin film silicon solar cell on a zinc oxide nano wire grown in a solution of zinc nitrate hydrate and hexamethylenetetramine (HMT), without using an expensive seed such as Au.

Although such a conventional technique is improved in that an expensive seed is not used, it does not solve the problem of permeability and resistance related to the aspect ratio.

DISCLOSURE

This invention was supported by the Global Frontier R&D Program on Center for Multiscale Energy System funded by the National Research Foundation under the Ministry of Science, ICT & Future, Korea (2011-0031578).

Technical Problem

Therefore, the present invention has been made in view of the above problems, and it is an object of the present invention to provide a method of forming a nanometer-scale prominence and depression structure on a zinc oxide thin film in a wet-etching method.

Technical Solution

To accomplish the above object, according to one aspect of the present invention, there is provided a method of forming a prominence and depression structure on a zinc oxide thin film, the method including the steps of: preparing a substrate; forming a nano structure having a height and a width of a nanometer range; forming the zinc oxide thin film on the substrate on which the nano structure is formed; and wet-etching the zinc oxide thin film, in which in the wet-etching step, zinc oxide having relatively low physical compactness is preferentially etched since the zinc oxide is positioned on the nano structure, and thus the prominence and depression structure is formed around the nano structure by the etching.

The inventors of the present invention have invented a method of performing wet-etching after intentionally forming a portion of a zinc oxide thin film having inferior physical compactness by forming a nano structure of a nanometer range on a substrate using a different material before the zinc oxide thin film is formed, as a result of a study on a method of fabricating a zinc oxide prominence and depression structure using the feature of preferentially etching a structurally weak portion when the zinc oxide thin film is wet-etched.

A size of the zinc oxide prominence and depression structure may be adjusted by adjusting the size and space of the nano structure and the thickness of the zinc oxide thin film, and a nanometer-scale zinc oxide prominence and depression structure may be formed.

At this point, the step of forming a nano structure may be performed through photolithography patterning, or physical vapor deposition or chemical vapor deposition. The photolithography may form a nano structure in a variety of shapes and sizes, and the physical vapor deposition and the chemical vapor deposition may form a nano structure within a short period of time.

In addition, the step of forming the zinc oxide thin film may be performed through the physical vapor deposition or the chemical vapor deposition. The method of forming the zinc oxide thin film is not specially limited.

Meanwhile, after the step of wet-etching the zinc oxide thin film, a step of removing the nano structure exposed outside by etching the zinc oxide thin film may be further included.

In addition, before the step of forming a nano structure, a step of forming a conductive layer or an adhesive layer on the substrate may be further included. The conductive layer may be applied as an electrode, and the adhesive layer complements adhesiveness between the nano structure and the substrate or the zinc oxide thin film and the substrate.

A method of manufacturing a thin film solar cell according to the present invention includes the steps of: forming a zinc oxide prominence and depression structure on a substrate in a method described above; forming a thin film semiconductor layer of multiple layers on the zinc oxide prominence and depression structure; and forming an electrode on the thin film semiconductor layer of multiple layers.

A method of manufacturing a dye-sensitized solar cell according to the present invention includes the steps of: forming a zinc oxide prominence and depression structure on a substrate in a method described above; forming a dye layer for transferring electrons, which are adsorbed to the zinc oxide prominence and depression structure and excited due to radiated sun light, to the semiconductor electrode; and forming an opposite electrode opposing the semiconductor electrode.

A method of manufacturing an organic solar cell according to the present invention includes the steps of: forming a zinc oxide prominence and depression structure on a substrate in a method described above; forming an organic photoactive layer on the zinc oxide prominence and depression structure; and forming an electrode on the organic photoactive layer.

Advantageous Effects

Since the present invention configured as described above may adjust the space of a prominence and depression structure by forming the prominence and depression structure on a zinc oxide thin film in a wet-etching method, a thin film can be uniformly formed on the prominence and depression structure, and an electrolyte or an organic material may uniformly penetrate between the prominence and depression structure.

In addition, in the present invention, since the aspect ratio of the prominence and depression structure may be adjusted and the prominence and depression structure is connected as a whole by forming the prominence and depression structure on a zinc oxide thin film in a wet-etching method, the problem of increasing resistance due to excessive difference of the aspect ratio does not occur.

If a thin film solar cell is manufactured in the manufacturing method of the present invention, an optical absorption area is greatly increased, and moving distance of electrons and holes is reduced and recombination of the electrons and holes is prevented, and thus efficiency of the solar cell is improved.

If a dye-sensitized solar cell or an organic solar cell is manufactured in the manufacturing method of the present invention, the area of the dye layer and the organic layer is increased, and thus efficiency of the solar cell is improved.

MODE FOR INVENTION

The preferred embodiments of the invention will be hereafter described in detail, with reference to the accompanying drawings.

Figure 1:
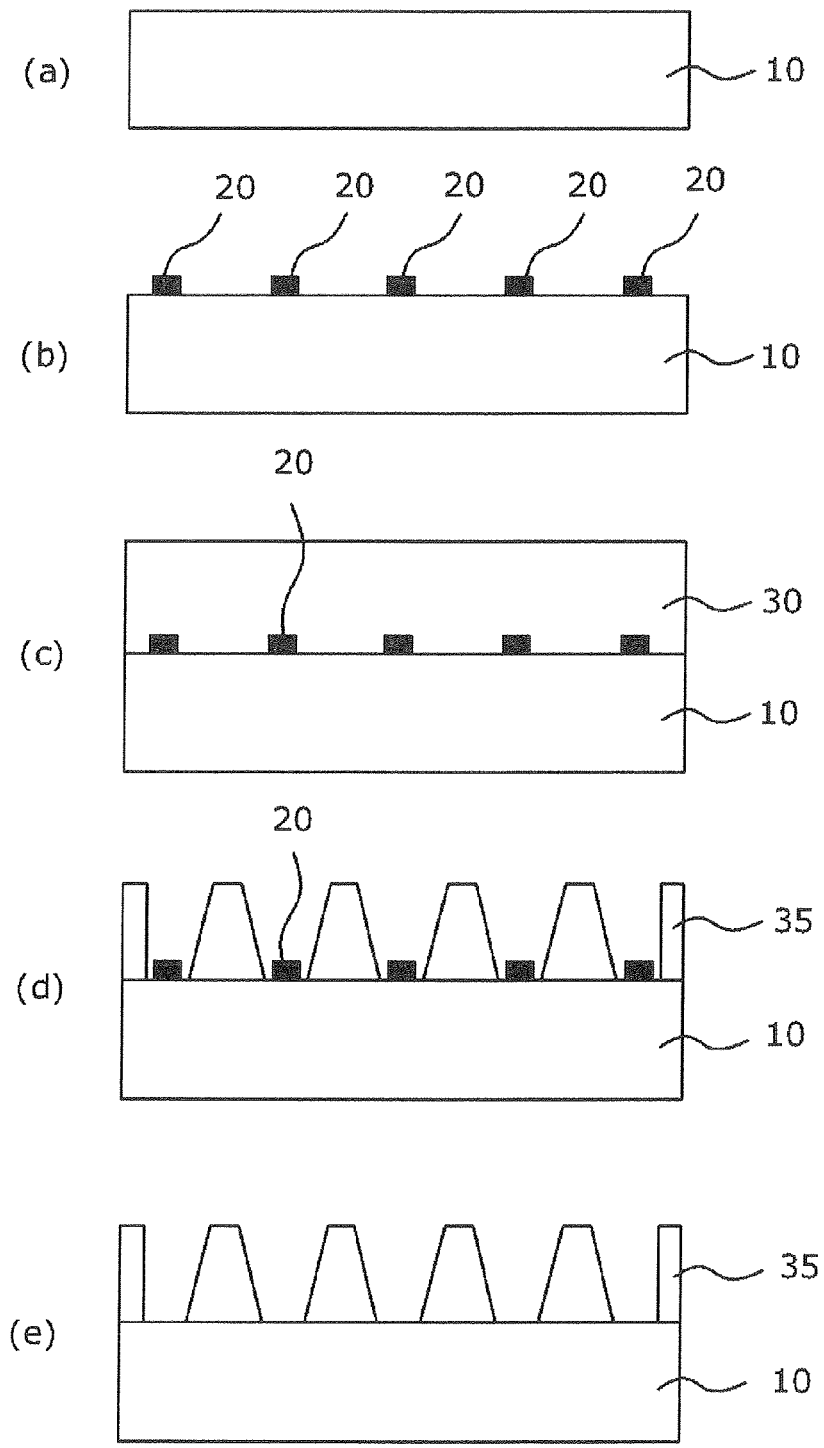
FIG. 1 is a mimetic diagram showing a method of forming a zinc oxide prominence and depression structure according to an embodiment of the present invention.

FIG. 1 is a mimetic diagram showing a method of forming a zinc oxide prominence and depression structure according to an embodiment of the present invention.

The method of fabricating a zinc oxide prominence and depression structure of the embodiment largely includes the steps of forming a nano structure having a height and width of nanometers on the surface of a substrate (FIG. 1(b)), forming a zinc oxide thin film on the substrate on which the nano structure is formed (FIG. 1(c)) and forming a prominence and depression structure by wet-etching the zinc oxide thin film (FIG. 1(d)).

First, a substrate 10 is prepared, and the surface thereof is cleaned to form a nano structure on the surface.

A type of the substrate is not specially limited, and a variety of materials such as glass, metal, plastic, ceramic or the like can be used, and a transparent or opaque substrate, a solid hard substrate, or a flexible substrate may be applied.

Particularly, a substrate 10 of a glass material having excellent light transmittance may be used, and the surface thereof is cleaned using acetone, isopropyl alcohol or distilled water.

A method of disposing a nanometer-scale structure on the surface of a substrate may be applied as a method of forming a nano structure 20 on the surface of the substrate 10 without particularly being restricted. Specifically, deposition of particles accomplished by forming a pattern through photolithography or using physical or chemical vapor deposition may be used.

The photolithography is a method of remaining a photoresist material, the property of which is changed by light, on the surface of a substrate in a desired pattern by exposing the photoresist material, and it is advantageous in that the pattern can be formed in a variety of shapes and sizes. A mask used in the process of exposing the photoresist to light may be selected among a hard contact type, a proximity type and a projection type, and the size and space of the nano structure are determined by the pattern formed on the mask. Accordingly, a nano structure of a totally uniform pattern or a partially uniform pattern can be selectively formed, and the shape of the nano structure may be diversely configured.

The physical vapor deposition and the chemical vapor deposition are methods of deposing a raw material by moving the raw material to the surface of the substrate in a gas state, and the physical vapor deposition is different from the chemical vapor deposition in that only physical phase transformation of changing a gas state into a solid state occurs in the deposition process of the physical vapor deposition, whereas a chemical reaction occurs among the raw materials in the deposition process of the chemical vapor deposition. The physical vapor deposition includes sputtering, e-beam evaporation, thermal evaporation, Laser Molecular Beam Epitaxy (L-MBE), Pulsed Laser Deposition (PLD) and the like, and the chemical vapor deposition includes Metal-Organic Chemical Vapor Deposition (MOCVD), Hydride Vapor Phase Epitaxy (HVPE) and the like.

The vapor deposition methods progress the deposition by heating and evaporating a raw material in a vacuum state and then condensing the raw material on the surface of a substrate and may use a cluster formed on the surface of the substrate in the initial stage of the deposition as a nano structure. Specifically, if deposition time is adjusted while Ag is deposed at a speed of 1 nm/sec, an Ag cluster having a height and a width of a few nm to a few um may be formed. At this point, a totally or partially aligned Ag cluster may be formed using a patterned mask, and the size and space of the nano structure can be adjusted through the Ag cluster. On the other hand, even when a mask is not used, the Ag cluster may be formed at a random position, and in this case, although the position of the nano structure may not be aligned, since the speed of forming the nano structure is fast, this may be selectively applied according to the application object of the zinc oxide prominence and depression structure.

Next, the zinc oxide thin film 30 is deposited on the glass substrate 10 on which the nano structure 20 is formed.

The method of depositing the zinc oxide thin film 30 is not specially limited. A physical vapor deposition such as RF magnetron sputtering, DC magnetron sputtering, thermal evaporation, e-beam evaporation or the like or a chemical vapor deposition such as LPCVD, spray pyrolysis or the like may be applied.

Then, diverse impurities may be added to the zinc oxide thin film 30 in order to improve physical properties. At this point, typically, Al, Ga, B, Mn, Co, Fe and the like may be used as the impurities.

At this point, a partial difference of compactness of the zinc oxide thin film 30 may occur due to the nano structure 10 partially formed at the lower portion, and physical compactness of the zinc oxide thin film 30 positioned on the nano structure 10 is relatively low.

Finally, a zinc oxide prominence and depression structure 35 is formed by wet-etching the zinc oxide thin film. If the wet-etching is performed according to the embodiment, the zinc oxide thin film formed on the nano structure 20 with low compactness is etched first, and finally, the prominence and depression structure 35 is formed by the anisotropic etching.

The etching solution used in the wet-etching may be an acid solution such as HCl or $H_2C_2O_4$ of 0.1~10%, and although the etching time should be variably adjusted according to the concentration, the etching time is short due to the characteristic of the process.

Then, a step of removing the nano structure 20 exposed outside by the zinc oxide prominence and depression structure 35 formed by the wet-etching (FIG. 1(e)) may be added.

A method which least affects the zinc oxide prominence and depression structure 35 should be selected according to the material of the nano structure 20, and the nano structure 20 may be removed using plasma. In the case where the nano structure is formed through the photolithography, the nano structure may be removed using a photoresist removing agent.

Figure 2:
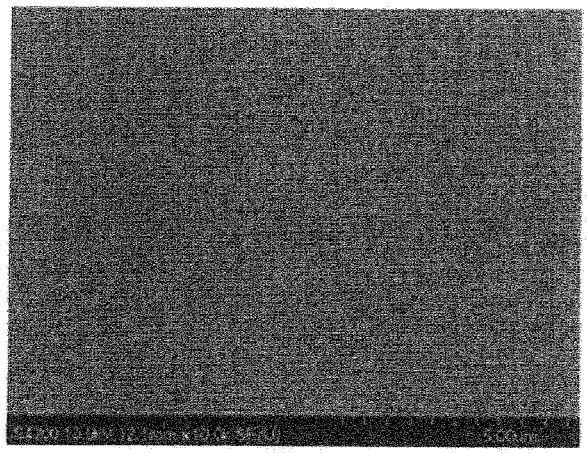
FIG. 2 is a view showing a microscopic picture photographing the surface of a sample fabricated according to an embodiment of the present invention.
Figure 2:
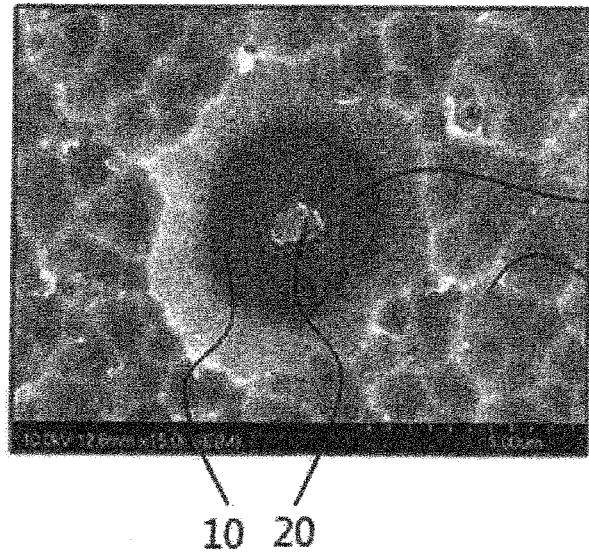

FIG. 2 is a view showing a microscopic picture photographing the surface of a sample fabricated according to an embodiment of the present invention. FIG. 2(a) is a picture photographing the surface of the zinc oxide thin film 30 corresponding to FIG. 1(c), and FIG. 2(b) is a picture photographing the zinc oxide prominence and depression structure 35 formed after the wet-etching corresponding to FIG. 1(d) is performed at the same position.

A nano structure is formed on the sample shown in the figures through the photolithography, and the photolithography process progresses to the next step.

AZ5214, which is a negative photoresist, is coated on the surface of the glass substrate 10 for thirty seconds at a speed of 5500 rpm using a spin coating device and is soft-baked at a temperature of 90° C.

Then, the AZ5214 is exposed to light for three seconds through a mask using a 365 nm ultraviolet light source of 10 W. At this point, the mask may be selected among a hard contact type, a proximity type and a projection type, and a nano structure of a dot shape is formed on this sample.

Next, after baking the sample at 115° C. for 90 seconds, a whole surface exposure process is performed for six seconds using the same light source. Next, a development process is performed for forty seconds using an AZ329 developing solution, and finally, a nano structure 20 having a thickness of 500 nm and a width of 3 μm is patterned on the glass substrate 10 by hard-baking the sample at 120° C. for three minutes.

A ZnO:Al film doped with aluminum is deposited on the zinc oxide thin film 30 at a thickness of 1 μm through an RF magnetron sputtering process. A ZnO target (1.5 wt % $Al_2O_3$) doped with aluminum is used as a target, and the film is deposited at a deposition pressure of 1.5 mTorr and a deposition power density of 1.5 W/$cm^2$, and temperature of the substrate maintains 200° C. when the deposition is processed.

Then, the wet-etching process is progressed for sixty seconds in a dilute hydrochloric acid (0.5% HCl) solution.

First, when the zinc oxide thin film 30 is formed through magnetron sputtering, although a nano structure 20 having a thickness of 500 nm is positioned at a lower portion as shown in FIG. 2(a), a notable defect is not shown on the surface of the zinc oxide thin film 30 having a thickness of 1 μm.

However, as shown in FIG. 2(b), when the wet-etching is progressed, there is a difference in the degree of etching, which is divided into etched area I and etched area II, and it is confirmed that a big difference occurs in the degree of etching due to an unnoticeably minute difference in compactness.

In the area shown as etched area I, since compactness of the zinc oxide thin film is relatively low due to the nano structure 20 formed at the lower portion, the wet-etching is progressed in a very speedy way, and the etching is progressed so as to show the surface of the substrate 10 and the nano structure placed in the middle of the substrate 10, and the area shown as etched area II is an area where the nano structure is not formed at the lower portion, and it is confirmed that projections and depressions of merely a surface texturing level are formed according to a minute difference in the compactness.

Particularly, since the etched area I shows a uniform etched area of a circular shape centering on the nano structure 20 of a dot shape, the position of the etched area can be adjusted. In addition, since the etched surface is inclined and the etched area is formed in the shape of a truncated cone, a uniform thin film can be deposited thereon, and an electrolyte or an organic material may easily penetrate between the prominence and depression structure 35.

Furthermore, since the zinc oxide prominence and depression structure 35 is connected as a whole, except the area etched to the surface of the substrate, resistance thereof is high compared with individually configured nano wires, and it may function as an electrode by itself.

Figure 3:
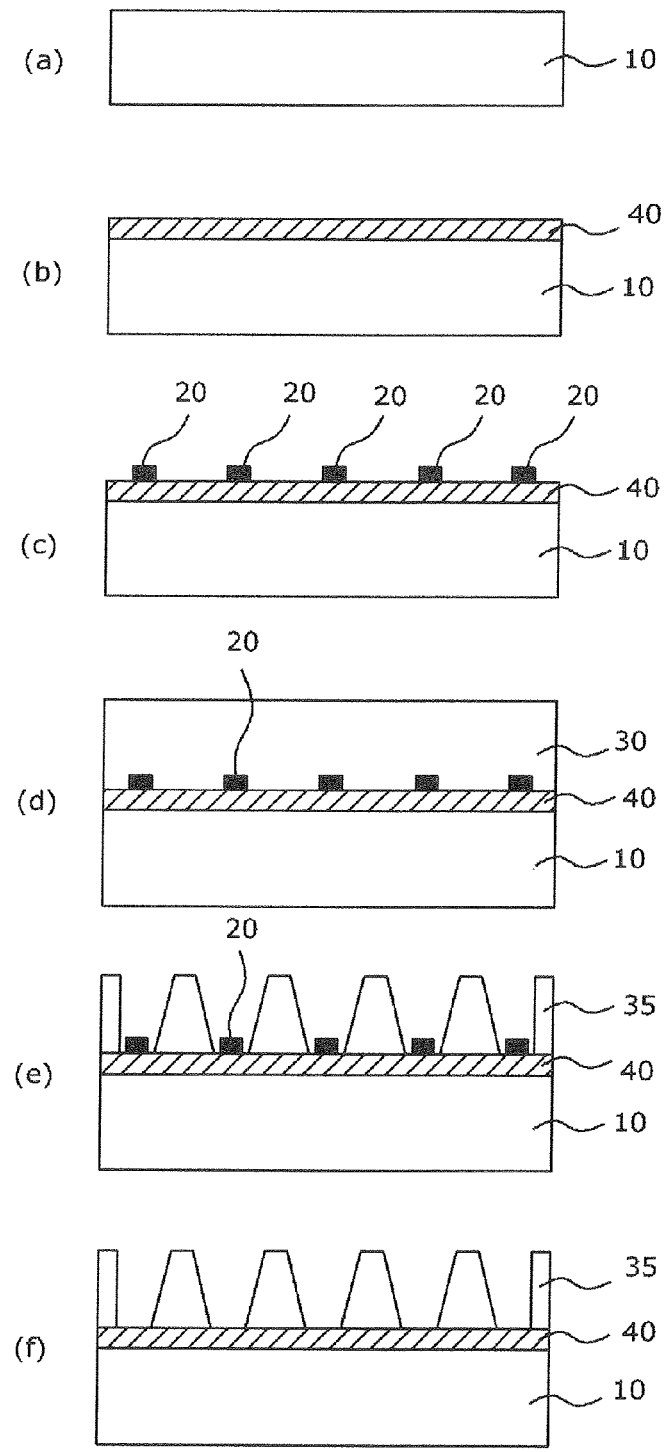
FIG. 3 is a mimetic diagram showing a method of forming a zinc oxide prominence and depression structure according to another embodiment of the present invention.

FIG. 3 is a mimetic diagram showing a method of forming a zinc oxide prominence and depression structure according to another embodiment of the present invention. The method of fabricating a zinc oxide nano structure of the embodiment largely includes the steps of forming a conductive layer on the surface of a substrate (FIG. 3(b)), forming a nano structure 20 on the conductive layer (FIG. 3(c)), forming a zinc oxide thin film on the conductive layer on which the nano structure is formed (FIG. 3(d)) and forming a prominence and depression structure by wet-etching the zinc oxide thin film (FIG. 3(e)). In this embodiment, a step of forming a conductive layer 40 on the substrate is further included, compared with the embodiment described above.

The conductive layer 40 may be formed using a metal material such as Ag or Al having excellent electrical conductivity or a transparent conductive film material such as ITO. Such a conductive layer 40 is remained without being etched in the wet-etching process and may be electrically connected to the zinc oxide prominence and depression structure 35 and used as an electrode.

Since the steps other than the step of forming the conductive layer 40 are the same as those of the embodiment described above, details thereof will be omitted.

Figure 4:
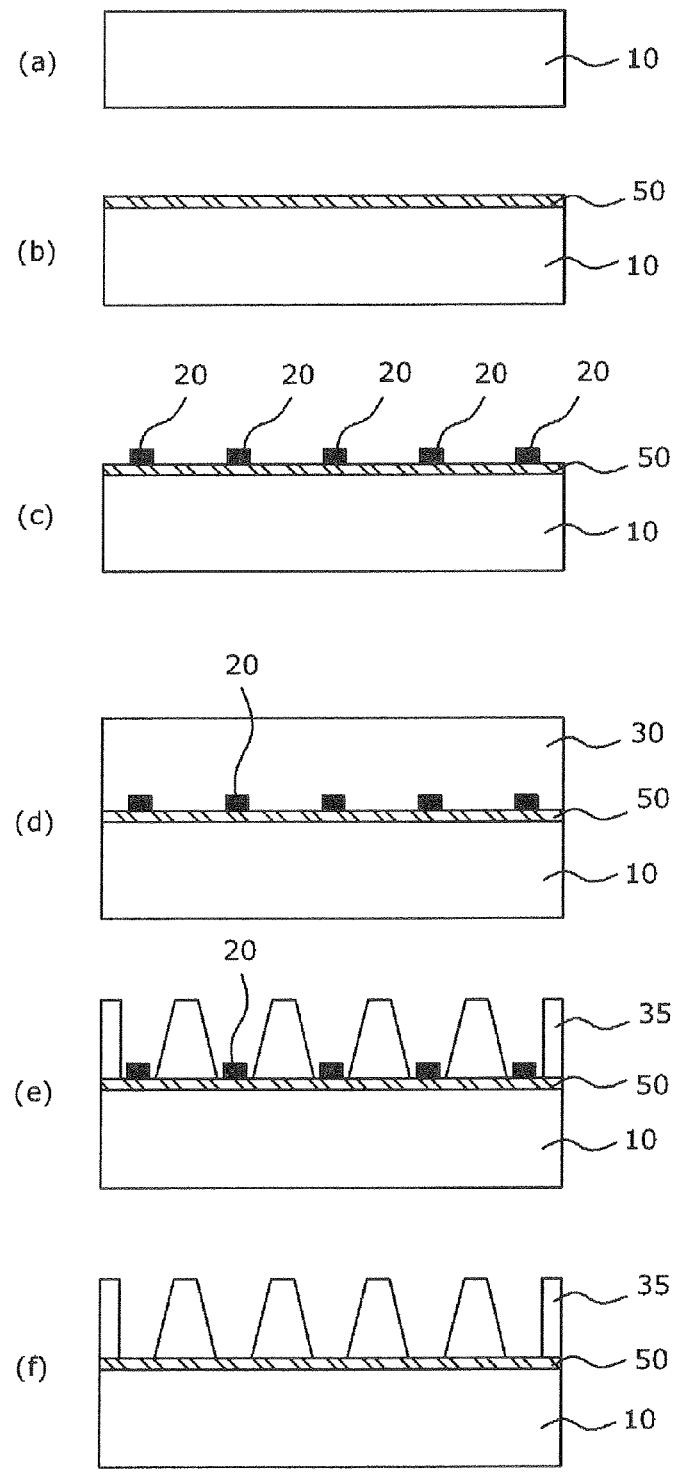
FIG. 4 is a mimetic diagram showing a method of forming a zinc oxide prominence and depression structure according to another embodiment of the present invention.

FIG. 4 is a mimetic diagram showing a method of forming a zinc oxide prominence and depression structure according to another embodiment of the present invention. The method of fabricating a zinc oxide nano structure of the embodiment largely includes the steps of forming an adhesive layer on the surface of a substrate (FIG. 4(b)), forming a nano structure 20 on the adhesive layer (FIG. 4(c)), forming a zinc oxide thin film on the adhesive layer on which the nano structure is formed (FIG. 4(d)) and forming a prominence and depression structure by wet-etching the zinc oxide thin film (FIG. 4(e)). In this embodiment, the step of forming an adhesive layer 50 on the substrate is further included, compared with the embodiment described above.

The adhesive layer 50 is added to secure adhesiveness of the nano structure 20 or the zinc oxide thin film 30, and it can be formed of a material such as Cr, Ni, Ni—Cr or the like.

Since the steps other than the step of forming an adhesive layer 50 are the same as those of the embodiment described above, details thereof will be omitted.

Figure 5:
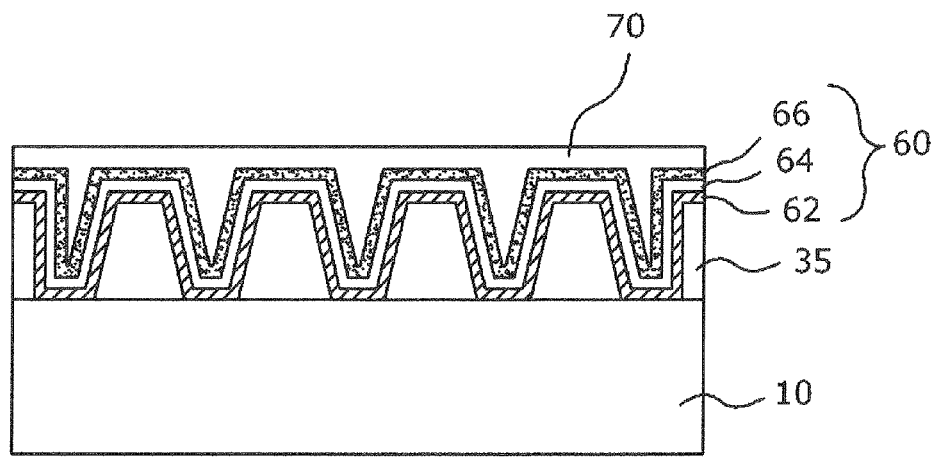
FIG. 5 is a mimetic diagram showing the structure of a thin film type solar cell manufactured by a thin film type solar cell manufacturing method of the present invention.

FIG. 5 is a mimetic diagram showing the structure of a thin film type solar cell manufactured by a thin film type solar cell manufacturing method of the present invention.

In the process of manufacturing a thin film type solar cell of the embodiment, first, a zinc oxide nano structure 35 is formed, and a thin film silicon layer 60 of a plurality of layers is formed thereon, and then an electrode 70 is formed thereon.

The basic structure of the zinc oxide prominence and depression structure 35 is the same as described in FIG. 1. The method of forming a zinc oxide prominence and depression structure 35 of the present invention may adjust the space of the zinc oxide prominence and depression structure 35, and since the thin film solar cell should have multiple thin film layers between the prominence and depression structure, the prominence and depression structure is formed to have a wide space.

The thin film silicon layer 60 includes three thin film layers 62, 64 and 66 related to a thin film silicon solar cell of an n-i-p or p-i-n type. The zinc oxide prominence and depression structure 35 formed according to the present invention may be applied to all kinds of thin film solar cells which use a thin film semiconductor layer, including the thin film silicon solar cell.

As shown in the figure, the thin film silicon layer 60 of three layers 62, 64 and 66 may be uniformly formed by forming the zinc oxide prominence and depression structure 35 according to the present invention to have a wide space.

The electrode 70 is formed on the n-i-p or p-i-n type thin film silicon layer 60 and flows electricity owing to potential difference. Although a case of forming an electrode on the entire surface is described in this embodiment, a mesh type electrode may be formed in some cases. In addition, a metal material such as Ag or Al or a transparent conductive film material such as ITO may be selectively applied as a material of the electrode 70.

Then, the thin film silicon solar cell of FIG. 5 shows a case of using the zinc oxide prominence and depression structure 35 as an electrode, and in order to enhance efficiency of the electrode, the zinc oxide prominence and depression structure shown in FIG. 3 is formed, and the conductive layer may be applied as a separate electrode.

Furthermore, although a thin film solar cell of the simplest structure is described in this embodiment, it is apparent to those skilled in the art that various techniques may be additionally applied in order to enhance efficiency of the solar cell.

Figure 6:
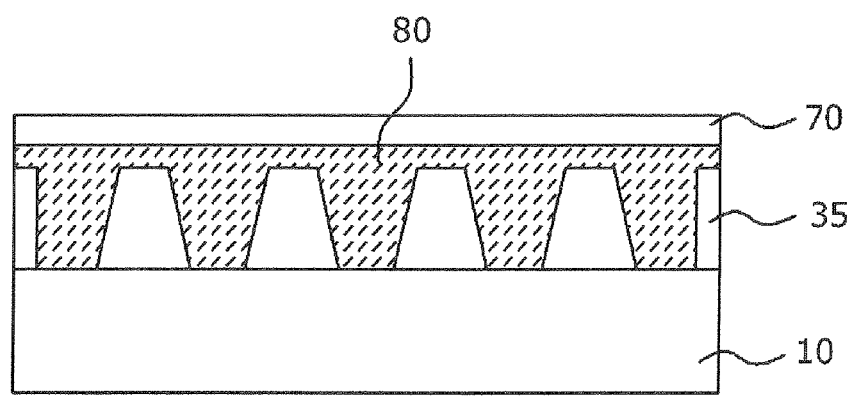
FIG. 6 is a mimetic diagram showing the structure of a dye-sensitized solar cell or an organic solar cell manufactured by a dye-sensitized solar cell manufacturing method or an organic solar cell manufacturing method of the present invention.

FIG. 6 is a mimetic diagram showing the structure of a dye-sensitized solar cell or an organic solar cell manufactured by a dye-sensitized solar cell manufacturing method or an organic solar cell manufacturing method of the present invention.

In the process of manufacturing a dye-sensitized solar cell or an organic solar cell of the embodiment, first, a zinc oxide nano structure 35 is formed, and a dye layer or an organic layer 80 is filled therebetween, and then an electrode 70 is formed thereon.

The basic structure of the zinc oxide prominence and depression structure 35 is the same as described in FIG. 1. The method of forming a zinc oxide prominence and depression structure 35 of the present invention may adjust the space of the zinc oxide prominence and depression structure 35, and since it is further advantageous for the dye-sensitized or organic solar cell to have a further wider area contacting with the dye layer or the organic layer 80 filled between the prominence and depression structure, the prominence and depression structure is formed to have a narrow space.

The dye layer or the organic layer 80 is not specially limited to a specific material, but all kinds of materials can be applied.

The electrode 70 contacts with the dye layer or the organic layer 80 and flows electricity owing to potential difference. A metal material such as Ag or Al or a transparent conductive film material such as ITO may be selectively applied as a material of the electrode 70.

Then, the dye-sensitized or organic solar cell of FIG. 6 shows a case of using the zinc oxide prominence and depression structure 35 as an electrode, and in order to enhance efficiency of the electrode, the zinc oxide prominence and depression structure shown in FIG. 3 is formed, the conductive layer may be applied as a separate electrode.

Furthermore, although a dye-sensitized solar cell or an organic solar cell of the simplest structure is described in the embodiment, it is apparent to those skilled in the art that various techniques may be additionally applied in order to enhance efficiency of the solar cell.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

The invention claimed is:

1. A method of forming a prominence and depression structure, the method comprising the steps of:
   preparing a substrate;
   forming a nano structure having a height and a width of a nanometer range;
   forming a zinc oxide thin film on the substrate on which the nano structure is formed;
   wet-etching the zinc oxide thin film to preferentially remove the zinc oxide thin film positioned on the nano structure and having relatively low physical compactness, to form the prominence and depression structure in which the zinc oxide film projects above the nano structure exposed by the wet-etching; and
   after the wet-etching, removing the nano structure that was exposed by the wet-etching of the zinc oxide thin film.

2. The method according to claim 1, wherein the step of forming a nano structure is performed through photolithography.

3. The method of claim 2 wherein removing the nano structure that was exposed by the wet-etching of the zinc oxide thin film comprises using a photoresist removing agent to remove the nano structure that was exposed by the wet-etching of the zinc oxide thin film.

4. The method according to claim 1, wherein the step of forming a nano structure is performed through physical vapor deposition or chemical vapor deposition.

5. The method according to claim 1, wherein the step of forming the zinc oxide thin film is performed through physical vapor deposition or chemical vapor deposition.

6. The method according to claim 1, further comprising, before the step of forming a nano structure, the step of forming a conductive layer on the substrate.

7. The method according to claim 1, further comprising, before the step of forming a nano structure, the step of forming an adhesive layer on the substrate.

8. A method of manufacturing a thin film solar cell, the method comprising the steps of:
   forming the prominence and depression structure on the substrate in the method according to claim 1;
   forming a thin film semiconductor layer of multiple layers on the prominence and depression structure; and
   forming an electrode on the thin film semiconductor layer of multiple layers.

9. A method of manufacturing a dye-sensitized solar cell, the method comprising the steps of:
   forming a semiconductor electrode by forming the prominence and depression structure on the substrate in the method according to claim 1;
   forming a dye layer for transferring electrons, which are adsorbed to the prominence and depression structure and excited due to radiated sun light, to the semiconductor electrode; and
   forming an opposite electrode opposing the semiconductor electrode.

10. A method of manufacturing an organic solar cell, the method comprising the steps of:
    forming the prominence and depression structure on the substrate in the method according to claim 1;
    forming an organic photoactive layer on the prominence and depression structure; and
    forming an electrode on the organic photoactive layer.

* * * * *